US008378206B2

(12) United States Patent
Schuette et al.

(10) Patent No.: US 8,378,206 B2
(45) Date of Patent: Feb. 19, 2013

(54) THERMOELECTRIC ELEMENTS, METHOD FOR MANUFACTURING SAME, AND USE OF SAME

(75) Inventors: Ruediger Schuette, Alzenau-Hoerstein (DE); Thorsten Schultz, Hassenroth (DE); Georg Markowz, Alzenau (DE)

(73) Assignee: Evonik Degussa GmbH, Essen (DE)

( * ) Notice: Subject to any disclaimer, the term of this patent is extended or adjusted under 35 U.S.C. 154(b) by 764 days.

(21) Appl. No.: 11/984,703

(22) Filed: Nov. 21, 2007

(65) Prior Publication Data

US 2008/0121263 A1 May 29, 2008

Related U.S. Application Data

(60) Provisional application No. 60/866,765, filed on Nov. 21, 2006.

(30) Foreign Application Priority Data

Nov. 21, 2006 (DE) .......................... 10 2006 055 120

(51) Int. Cl.
 *H01L 35/32* (2006.01)
(52) U.S. Cl. ........................................ 136/205; 136/225
(58) Field of Classification Search ........... 136/200–242
 See application file for complete search history.

(56) References Cited

U.S. PATENT DOCUMENTS

| 2,519,785 A | | 8/1950 | Okolicsanyi | |
|---|---|---|---|---|
| 3,356,539 A | * | 12/1967 | Stachurski | ..................... 136/205 |
| 4,032,371 A | | 6/1977 | Andersen | |
| 4,149,025 A | * | 4/1979 | Niculescu | ..................... 136/206 |
| 4,513,201 A | * | 4/1985 | Falk | ............................. 250/342 |
| 5,168,339 A | * | 12/1992 | Yokotani et al. | ................ 257/64 |
| 5,705,434 A | * | 1/1998 | Imanishi et al. | ................ 438/55 |
| 6,005,182 A | * | 12/1999 | Imanishi et al. | ............. 136/201 |
| 6,872,879 B1 | | 3/2005 | Serras et al. | |

FOREIGN PATENT DOCUMENTS

| DE | 102 31 445 A1 | 1/2004 |
|---|---|---|
| EP | 0773 592 A2 | 5/1997 |
| JP | 2006-32850 | 2/2006 |

* cited by examiner

*Primary Examiner* — Basia Ridley
*Assistant Examiner* — Christina Chern
(74) *Attorney, Agent, or Firm* — Oblon, Spivak, McClelland, Maier & Neustadt, L.L.P.

(57) ABSTRACT

There are described thermoelectric elements that are manufactured by using a porous matrix or a porous substrate. The matrix consists of an electrically insulating material having sufficient thermal and chemical resistance as well as the lowest possible thermal conductivity, and is provided in predetermined regions with different thermoelectric materials, so that continuous conductors are formed in the matrix. These are electrically connected to one another to form thermocouples, which in turn are electrically interconnected with one another to form the thermoelectric element.

9 Claims, 11 Drawing Sheets

701   702   703

701   702   703   705

THERMOELECTRIC ELEMENTS, METHOD FOR MANUFACTURING SAME, AND USE OF SAME

CROSS REFERENCE TO RELATED APPLICATIONS

The present application claims priority to provisional application Ser. No. 60/866,765, filed Nov. 21, 2006 under 35 U.S.C. §119(e), and claims priority to German Patent Application Serial Number 102006055120.6-33, filed Nov. 21, 2006, under 35 U.S.C. §119(a). 60/866,765 and 102006055120.6-33 are hereby incorporated by reference in their entirety.

BACKGROUND OF THE INVENTION

1. Field of the Invention

The invention relates to the manufacture of thermoelectric elements (also referred to hereinafter as "TE elements") as well as to the products of the method and to the use of those products.

2. Background

The thermoelectric effect (also referred to hereinafter as "TE effect") was already discovered and described by Peltier and Seebeck in the 19$^{th}$ century. It was found that a relationship exists between the heat currents and electrical currents flowing through combinations of different metals, alloys or semiconductors (also referred to hereinafter as "TE materials"). On the one hand, a heat flow can create an electrical potential between the hotter and colder end of the TE material, and this can be exploited in the form of a current flow through a closed electrical circuit (Seebeck effect, thermoelectric generator). On the other hand, the application of an electrical potential to such materials leads not only to a current flow but also to a heat flow; i.e. one electrical contact face becomes hotter and the other becomes cooler (Peltier effect, Peltier elements).

Thermoelectric devices are also known as heat sensors for temperature measurement. Furthermore, they can also be used as heat pumps for cooling purpose. A detailed discussion of the scientific research and of the prior art can be found in "Thermoelectrics handbook: macro to nano", D. M. Rowe, CRC Press, 2006.

The TE effect has already been exploited in numerous applications for many years.

For example, thermoelements are used for temperature measurement. Peltier elements heat/cool in applications with low power demand or where compression refrigerating systems cannot be used for other reasons. Also known are thermoelectric generators (TEG), which generate electrical current from existing heat currents.

Thermoelements and Peltier elements are already available as mass-produced products. TEGs are on the threshold of becoming mass-produced products. For broad application, however, their unit costs relative to electrical output power are still too high and the efficiency is too low, especially in the case of TEGs.

In the present description, thermoelements, Peltier elements and thermoelectric generators are also designated as thermoelectric elements (also referred to hereinafter as "TE elements").

The quantity known as thermoelectric potential, or in other words the electrical voltage that can be generated, depends on the material-specific properties of the TE material, on the Seebeck coefficient and on the temperature difference. High Seebeck coefficients and large temperature differences lead to high thermoelectric voltages. In order to be able to draw large electrical power, a large heat flow must pass through a material with very good thermal insulation capacity. This necessarily means that large areas must be provided or/and very high Seebeck coefficients should exist. With the present methods for manufacturing TE elements, either it is not possible in practice to manufacture a large-area element or the manufacture of such TE elements would lead to exorbitant manufacturing costs. Research and development of the past years has therefore concentrated predominantly on increasing the Seebeck coefficient with new TE materials.

In recent years, the developments in nanotechnology have been accompanied by a noteworthy improvement in efficiency of TE materials. Via thin-film coatings or nanotube techniques, it is possible to produce two-dimensional or one-dimensional thermoelectric structures having a better TE effect compared to traditional "bulk" materials. Manufacturing methods based on these thin-film coatings also do not solve the problem of manufacturing large-area, inexpensive elements. As regards applications, these methods concentrate on the manufacture of microcomponents, such as chip coolers as well as current generators for microprocessors or wrist watches. Examples of known manufacturing methods can be found in DE 102 32 445 A1.

Thermoelectric generators and Peltier elements have therefore found broad application in areas in which they can be used as microcomponents. And in niches in which manufacturing costs are not decisive, such as space flight and satellite technology, thermoelectric elements have already been used successfully for decades. Nuclear reactors, for example, are used as the heat source.

In addition, however, numerous potential applications for TE elements exist. Because of the ever-shrinking energy resources and simultaneously rising energy demand, the use of thermoelectric generators as a renewable energy source would be of particular interest. There can be found numerous unexploited heat sources from which at least some electrical current could be obtained. Examples include:

Hot exhaust gases and wastewaters being discharged into a cooler environment.

Areas heated by the sun or other sources.

Floors and mats intended to insulate a cooler substructure.

Process technology functions that operate with large temperature differences, such as evaporation of cryogenic media (e.g. liquefied natural gas).

exploitation of the motor-vehicle exhaust gas heat as an electricity generator (fuel savings).

The use of TE elements as generators in the motor-vehicle exhaust pipe has already been tested in practice. In this case also, the manufacturing costs of the systems still argue against introduction into the automobile market (in this regard see "Commercialization of Thermoelectric Technology", Francis R. Stabler, General Motors Corporation. Mater. Res. Soc. Symp. Proc. Vol. 886, 2006 Materials Research Society).

Besides the difficulty of manufacture of large areas, all the extremely diverse TE elements that have already been applied and the potential areas of application imply yet another problem. The different areas of application involve very different material requirements. In some cases the temperatures are very high, above 1000° C. (e.g. nuclear reactor as the heat source); in other cases the temperature levels are very low (e.g. cryogenic evaporators). In some cases large temperature differences can be exploited; in other cases the material composition must be optimized for small available temperature differences. In some cases rigid structures of the TE elements are sufficient; in other cases it would be advantageous to have flexible TE elements. Furthermore, the external geometry, length, width and thickness of the TE elements should be adaptable as flexibly as possible to the application situation. The consequences are extremely diverse manufacturing methods, which sometimes are unique for individual applications. This circumstance makes the market for TE elements very highly segmented, and from the viewpoint of business economics makes it much more difficult to begin with developing production methods.

Intensive research and development work has led in recent years to the development of progressively more powerful TE materials. Nevertheless, the major part of research and development is concentrated on the development of new materials, whereas questions related to manufacturing methods and application techniques have commanded less attention.

The conventional process for manufacturing TE elements typically consists of the following steps:
 manufacture of TE materials doped in different ways (e.g. batchwise in shaking furnaces),
 airtight fusing of the metal mixtures in glass ampoules,
 crystal growth by vertical zone melting in the glass ampoules,
 sawing of the metal rods obtained in this way into slices ("wafers") of a few millimeters thickness,
 sputtering the wafer surfaces with contact enhancers (e.g. nickel),
 sawing of the wafers into cuboids ("legs"),
 arrangement of the n-legs and p-legs alternately in masks (matrices),
 placing of contact plates along with electrical contact zones and leads on both sides of the leg matrices,
 sintering of the obtained sandwich to the finished composite, and
 application of external electrical insulating layers.

The first four steps are typical semiconductor processing steps with high cleanliness requirements and little potential for automation. Also obvious is the large number of necessary piece-by-piece manipulations on the most diverse workpieces in the subsequent steps. Here also it is difficult to implement automation and continuous manufacture.

Already known manufacturing methods for TE elements are largely oriented toward methods that have become familiar from the manufacture and processing of semiconductors.

As an example, a method for manufacturing a thermoelectric layer structure is described in DE 102 30 080 A1. The manufacturing method is based on traditional Si wafer technology, wherein the different functional layers are applied successively to the wafer and structured by etch processes.

In DE 102 31 445 A1 a continuous manufacturing method for TE devices is described. Therein the alternating structures of p-doped and n-doped TE semiconductors typical of TE components are produced as continuous areas on insulating plastic films, which are then laminated on top of each other by winding them in a plurality of layers onto a drum. Pieces/strips are then cut out and provided with electrical contacts at the face sides, in order to obtain the necessary series interconnection of numerous alternating n-legs and p-legs. With this method it is not possible to produce flat arrays of TE legs; it is possible only to produce strips, through which electric current flows lengthwise. In order to obtain flat structures, either broad strips must be cut (in which case very high electric currents flow through them), or a flat structure must be pieced together from a plurality of strips.

From U.S. Pat. No. 6,300,150 B1 there is known a method in which thin-film TE devices are produced on wafers by means of traditional semiconductor technology. The manufacture of usable TE modules is achieved by traditional cutting of the raw wafer and reassembly in the needed n-p arrangement.

U.S. Pat. No. 6,396,191 B1 describes the construction of TE components composed of numerous TE-active layers with intermediate layers along the heat flow. Depending on the local temperature level within the layer structure suitable TE materials are used. Thus the concept of functionally graded TE elements is implemented here, in order to achieve the highest possible duty factors and usable electrical voltages by this interconnection. The manufacturing methods described in this patent fall within the range of traditional semiconductor processing and coating technologies.

With few exceptions, therefore, TE devices that have been available heretofore have not yet gained a foothold in the mass market, despite a principally achieved technical maturity and numerous demonstration systems. This has several reasons:
 High specific costs resulting from the manufacturing process (large number of usually expensive process steps).
 High consumption of expensive TE material.
 High specific weight of the modules.
 Low flexibility in shaping the modules.

SUMMARY OF THE INVENTION

Thus the object of this invention is to provide methods and the thermoelectric elements that can be obtained thereby which no longer have the aforementioned disadvantages.

A further object of this invention consists in providing a simple manufacturing method for thermoelectric elements that can be put into practice in an economically favourable way.

Yet another object of this invention consists in providing a manufacturing method for thermoelectric elements that can be adapted as simply as possible to the different requirements and designs of TE elements in different areas of use.

The present invention relates both to a novel design principle for TE elements as well as to the novel process for manufacturing TE elements that is needed to implement the said principle in industry, wherein the number of process steps is greatly reduced compared with the conventional processes and the remaining process steps are tailored consistently to continuous mass production. Thereby, any desired kind of TE material can be used.

In the inventive thermoelectric elements, as also in already known thermoelectric elements, a plurality of TE legs are joined together to form one or more thermocouples. By TE leg there is to be understood an electrically conductive region of TE material. When two TE legs of different TE materials are joined electrically, they form a thermocouple, which in turn is interconnected to obtain thermoelectric elements (TE elements).

The invention makes it possible to greatly lower the specific manufacturing costs of TE elements. In addition, the new manufacturing process permits the production of lighter, thinner and even flexible TE elements, and so, regardless of economic considerations alone, it opens up technologically new areas of application.

The present invention relates to a thermoelectric element having the features:
A) Flat carrier of porous electrically and thermally insulating material, which has a first and a second surface,
B) a first thermocouple, formed by at least one electrical conductor, running through the pores of the flat carrier from the first to the second surface and comprising a first thermoelectric material, and at least one electrical conductor, running through the pores of the flat carrier from the first to the second surface and comprising a second thermoelectric material, wherein the conductors comprising first and second thermoelectric materials run through the flat carrier in a manner electrically insulated from one another and are connected to one another in electrically conductive manner on or in the vicinity of one surface of the flat carrier, and the ends of the first thermocouple are located on or in the vicinity of the other surface of the flat carrier, C) a second thermocouple, formed by at least one electrical conductor, running through the pores of the flat carrier from the first to the second surface and comprising a first thermoelectric material, and at least one electrical conductor, running through the pores of the flat carrier from the first to the second surface and comprising a second thermoelectric material, wherein the conductors comprising first and second thermoelectric materials run through the flat carrier in a manner electrically insulated from one another and are connected to one another in electrically conductive manner on or in the vicinity of that surface of the flat carrier on or in the vicinity of which the first and second thermoelectric materials forming the first thermocouple are connected to one another in electrically conductive manner, and the ends of the second thermocouple are located on or in the vicinity of the other surface of the flat carrier, D) optionally further thermocouples, formed by at least one electrical conductor, running through the pores of the flat carrier from the first to the second surface and comprising a first thermoelectric material, and at least one electrical conductor, running through the pores of the flat carrier from the first to the second surface and comprising a second thermoelectric material, wherein the conductors comprising first and second thermoelectric materials run through the flat carrier in a manner electrically insulated from one another and are connected to one another in electrically conductive manner on or in the vicinity of that surface of the flat carrier on or in the vicinity of which the first and second thermoelectric materials forming the first thermocouple are connected to one another in electrically conductive manner, and the ends of the further thermocouples are located on or in the vicinity of the other surface of the flat carrier, E) electrically conductive connection of the ends of the first, second and optionally further thermocouples in a parallel and/or series circuit, and F) leads for feeding or draining electrical energy, which leads are electrically connected to the first, second and optionally further thermocouples.

The present invention further relates to a method for manufacturing the thermoelectric elements described hereinabove with the steps:

a) Providing a flat carrier of porous electrically and thermally insulating material having a first and a second surface, b) introducing at least one first thermoelectric material or a precursor thereof into predetermined regions of the flat carrier and introducing at least one second thermoelectric material or a precursor thereof into predetermined regions of the flat carrier, if precursors are used followed by applying suitable process steps for transforming the same into the respective thermoelectric materials, so that, running through the pores of the flat carrier from the first to the second surface, there are formed electrical conductors comprising a first thermoelectric material and electrical conductors comprising a second thermoelectric material, said conductors running through the flat carrier from one surface to the other surface in a manner electrically insulated from one another, c) establishing electrically conductive connections between the first thermoelectric material and the second thermoelectric material on one surface of the flat carrier to form a first thermocouple, whose ends emerge on the other surface of the flat carrier, d) repeating steps b) and c) one or more times, so that at least a second thermocouple is formed, and e) establishing an electrically conductive connection between one end of the first thermocouple with one end of the second thermocouple and optionally with one end of further thermocouples on the other surface of the flat carrier, so that first, second and optionally further thermocouples are interconnected with one another in a series circuit or parallel circuit.

Preferred embodiments of the inventive thermoelectric elements and of the inventive manufacturing method are described in the dependent claims.

DETAILED DESCRIPTION

Figure 1:
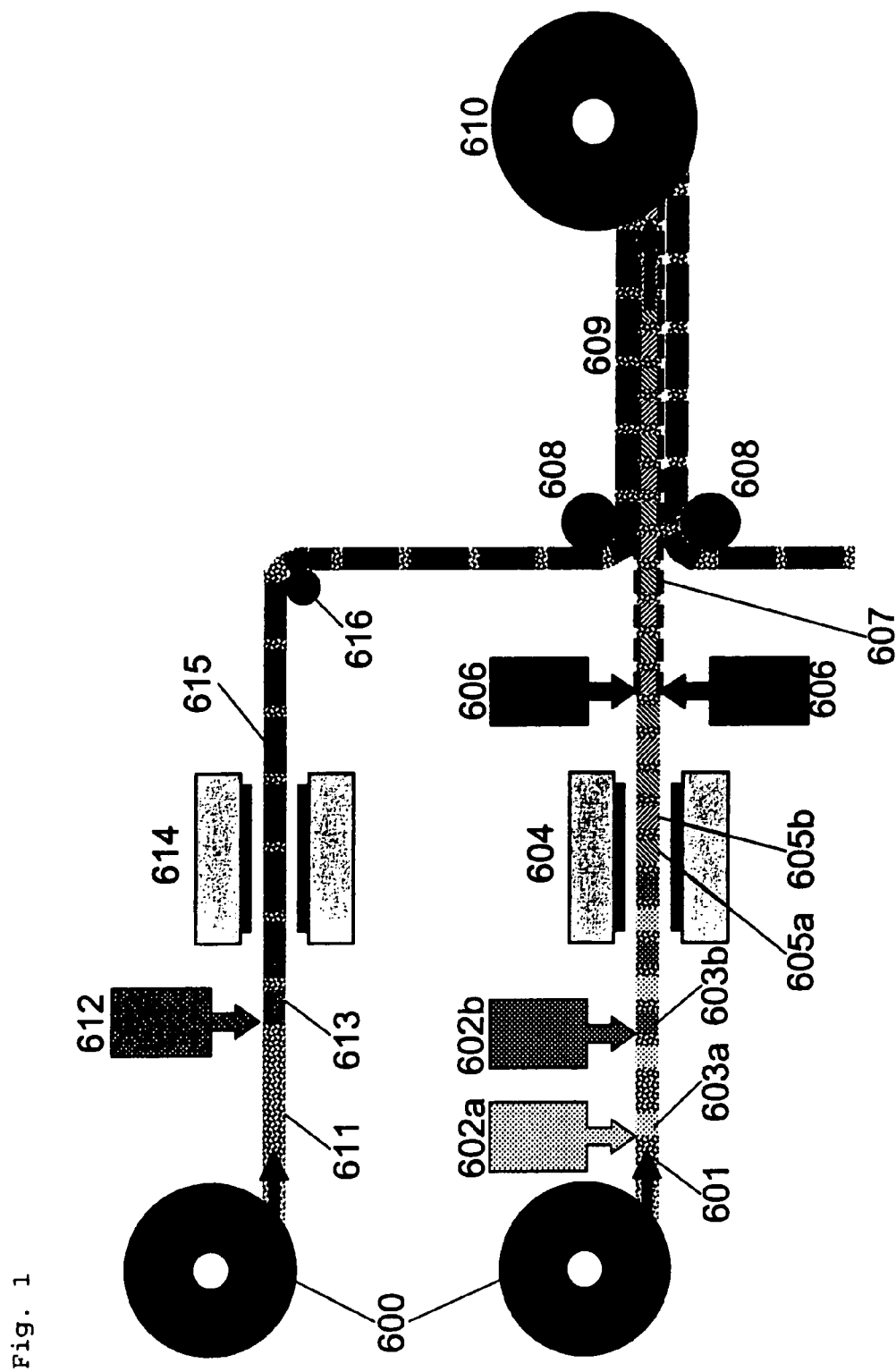
FIG. 1 shows one exemplary embodiment of the inventive method.

The quintessence of the design principle of the inventive thermoelectric elements and of the inventive manufacturing method is the use of a porous matrix or porous substrate (referred to hereinafter as "flat carrier"). This is composed of an electrically insulating material having sufficient thermal and chemical resistance, the lowest possible thermal conductivity and has a top side and a bottom side, i.e. it has length and width dimensions that extend substantially beyond the dimension in the remaining spatial direction (thickness). Typically the thickness of the flat carrier lies in the range of 0.5 to 10 mm, although carriers with smaller or larger thicknesses can also be used in the inventive method.

The flat carrier can be rigid or flexible. All necessary steps for manufacture of a TE leg take place on or at the flat carrier or in the pores/cavities of this flat carrier, thus enabling continuous manufacture without complex individual manipulation between the process steps. The flat carrier passes through the manufacturing process either in the form of plates (rigid material) or "from roll to roll" ("roll-to-roll") in the case of a flexible material. The latter alternative borrows greatly from typical manufacturing methods for paper, plastic films or textile fabrics, whereas the first alternative is to be regarded as analogous to manufacturing processes for insulating boards or laminate floors. Thus mature technologies that can be easily adapted are already available for handling (conveying and assembling) both carrier classes.

To manufacture an inventive TE element, thermoelectric materials suitable for the intended use, preferably TE semiconductor materials (typically of n-doped and p-doped type) are now introduced in appropriate manner into the pores of the flat carrier, in order to obtain an array of legs that extend continuously through the flat carrier from top side to bottom side but are electrically insulated from one another within the flat carrier. It is therefore imperative that the pores or the combination of pores in the flat carrier be sufficiently continuous from top side to bottom side in the flat carrier. On the other hand, the constitution of the pore walls as well as possible winding nature (tortuosity) of the pores is of minor importance. Flat carriers provided with continuous TE legs in that way will also be referred to hereinafter as a TE layer.

Different process measures, all of which can be used in the inventive method, are possible in order to achieve the necessary electrical interconnection of the legs. They include in particular the following three procedural measures, which can be used individually or in combination in the inventive method:

1. Direct application of a conductor path structure on the top side and/or bottom side of the TE layer, for example by sputtering, printing processes, vapour deposition or other application methods.
2. Fabrication of conductor path structures in or on a porous substrate, i.e. according to a method analogous to the manufacture of the TE layer, and combination of this porous substrate with the TE layer.
3. Fabrication of conductor path structures on or in a dense or porous substrate by coating, etching or other application or material-removal methods and combination of this substrate with the TE layer.

The separate devices manufactured continuously in this way according to the second or third process measure (and designated hereinafter as interconnecting layers) are permanently bonded to the TE layers in a further process step. For this purpose, these different functional layers are arranged on top of each other, optionally also supplemented on one or both outer sides by an electrical insulating layer as well as by an electrical contact enhancing layer at the electrical contact faces between TE legs and conductor paths, and are permanently bonded with one another in the form of a multi-level sandwich structure by suitable methods, such as sintering, gluing, pressing, fusing, welding or soldering.

The electrical contact within the conductor structures of the individual TE legs, as well as the contact between TE legs by means of the interconnecting layer(s), is of special importance, since the electrical junction resistance greatly influences the thermoelectric efficiency. Soldering of the conductors emerging from the substrate surface is preferred in order to establish an electrical connection of the conductors forming the thermoelectric legs and/or of the conductors of neighbouring legs at the surface of the flat carrier. It is particularly preferred that the electrical contact be improved with metal foils, which rest on the top side and/or on the bottom side of the carrier/substrate. These can be pure metal foils or metallised or metal-coated polymer foils, paper or tissue foils. These foils must be structured into electrically insulated or connected areas corresponding to the desired thermoelectric interconnection after the process of manufacture of the conductors in the flat carrier or possibly after the soldering process for connecting conductors and foil. The structuring can be achieved mechanically by milling or cutting the surfaces. In the case of very narrow structures and thin carrier substrates, it is recommended that the metal surface be cut with a laser beam.

What is preferred, however, is the use of metallised foil with prefabricated conductor structures, which are offered in various methods and materials as well as customer-specific structures. The large number of packaging materials with metallic patterns should be sufficient evidence at this place.

During subsequent assembly, the sandwich structures obtained in this manner can be subdivided into smaller modules as needed by the desired method, for example by sawing, cutting, laser cutting, water-jet cutting or punch-cutting, and equipped with electrical contacts, such as solder lugs, contact legs, jacketed cables and/or plug contacts.

Moreover, the thermoelectric elements can be encapsulated, for example by potting, shrink-in-place methods or foil welding.

If, for a given application situation, thicker structures are needed than can be manufactured with the method described hereinabove, a plurality of levels of identical layers can be combined in the sandwich instead of individual levels. This can be interesting for TE layers in particular. In this case the different TE legs arranged on top of each other in such a way do not necessarily have to be made of the same TE materials, but instead what is known as functional grading can also be achieved in this way. This ensures that each of the different TE materials is operated in the optimal temperature range, in order that a given temperature window can be covered with optimal overall efficiency.

In order to implement the described invention, the cited different materials must meet highly specific requirements and have highly specific properties or combinations of properties. These will be described systematically hereinafter for all cited material classes.

The described desired final structure and the manufacturing process lead to a series of requirements for the material of the flat carrier:
  Mechanical toughness (e.g. in particular sufficient breaking and tearing strength).
  Sufficient flexibility in the "roll-to-roll" manufacturing method.
  Low abrasion.
  Sufficient void fraction (pore volume).
  Sufficiently continuous pores or pore combinations.
  Suitable pore-radius distribution (depending on the introduction method for TE material).
  Thermal stability (depending on manufacturing process and application situation).
  Low thermal conductivity (the main heat flow should pass through the TE legs).
  Electrically insulating.

Defined wettability both of the pore walls and of the outer sides (depending on the substances and auxilliaries used and to be introduced in the manufacturing process).

Low density (weight savings).

Coefficients of thermal expansion matched to the other layers of the finished sandwich structure These requirements can be met among others, but not exclusively, by the following material classes:

Textile fabrics on the basis of glass fibers (solid and/or hollow fibers), such as woven cloths, warp knits, weft knits, gauzes, felts or especially fleeces.

Textile fabrics on the basis of natural fibers or synthetic fibers (solid and/or hollow fibers), such as woven cloths, warp knits, weft knits, gauzes, felts or especially fleeces.

Fabrics of mineral/ceramic solid and/or hollow fibers, such as fleeces or felts.

Porous sintered articles of ceramic materials.

The flat carrier may be an electrically and thermally insulating textile fabric, an open-pore foam material, a sponge or a sintered article, which are composed of organic or inorganic polymers, glass, ceramic materials, carbides, nitrides, borides or mixtures thereof.

Materials based on hollow fibers have the advantage that they typically have lower thermal conductivity and lower density than solid fibers. In addition, the mechanical properties are often superior.

Furthermore, the properties of flexible carriers can sometimes be improved by coatings. Such coatings can be composed, for example, of polymers, glass, ceramic or hard materials, such as carbides or nitrides.

Any desired mixtures of the aforesaid substances can also be used as coatings, whereas they can be applied on the flexible carrier in the form of films or adhering particles.

The requirements for interconnecting layers are similar to those for TE substrate materials (flat carriers). In contrast to the TE substrate materials, however, the highest possible thermal conductivity, e.g. low resistance to heat transport, is frequently also required in this case and dense and pore-free carriers can be used besides porous substrates.

Besides the materials listed in the foregoing for the flexible carriers, the following material classes can also be used for porous interconnecting layers:

Metal fabrics provided with electrically insulating coatings, preferably flexible fabrics of metal filaments provided with electrically insulating coatings, such as woven cloths, warp knits, weft knits, gauzes, felts or fleeces.

The requirements to be imposed on dense substrate materials for the interconnecting layer are similar to those of substrate materials for porous interconnecting layers.

These requirements can be met for example, but not exclusively, by the following material classes:

Densely filled or densely coated composites of textile fabrics based on ceramic fibers, mineral fibers, natural fibers or plastic fibers, such as woven cloths, warp knits, weft knits, gauzes, fleeces or felts of solid or hollow fibers.

Plastic foils or plates.

Ceramic plates.

Densely filled or densely coated metal fabrics, preferably flexible fabrics of metal filaments provided with electrically insulating coatings, such as woven cloths, warp knits, weft knits, gauzes, felts or fleeces.

Since good thermal conductivity is frequently needed in the interconnecting layers, solid fibers generally have advantages compared with hollow fibers in this case. Under certain circumstances, however, a suitable functional filling in the hollow fibers can help or even add special benefits in this case.

Furthermore, just as for the TE substrate materials, the properties of the interconnecting layers can sometimes be improved by coatings. For this purpose the same materials as described for TE substrate materials can be used. Coatings of metal oxides on electrically nonconductive carrier materials even open up the possibility of reducing them spotwise to metal and thus completely creating or supporting the needed conductor path structures. Such transformations can be achieved, for example, by selective spotwise activation of the coating.

This can be accomplished, for example, by heating with lasers, plasmas, electric arcs or induction, or by irradiation with lasers, X-ray sources, particle-beam sources or UV lamps, or by electric fields or by magnetic fields or by means of focused ultrasound.

In the process, it is possible simultaneously to use a reducing atmosphere, such as hydrogen gas, carbon monoxide or synthesis gas, or wetting with a liquid reducing agent, or reactive components that are admixed with the coating and that become activated simultaneously or alone.

The inventive thermoelectric elements preferably comprise electrically insulating layers. The requirements to be imposed thereon are similar to those of substrate materials for the interconnecting layer.

These requirements can be met, for example, by the above material classes for the dense and porous interconnecting layers. In addition, the electrical insulating layers can be formed by coatings of all kinds, such as synthetic resins, lacquers, powder lacquers, ceramic burn-in coatings or enamel.

In principle, any TE material that is already known or that will be developed in the future can be used to manufacture the inventive thermoelectric elements, provided it is suitable for the various processing steps of the inventive manufacturing process.

In principle, all metals are candidates as thermoelectric conductors, including alloys and intermetallic compounds. Examples of metals are chromium, iron, copper, nickel, platinum, rhodium or titanium. Preferably, semiconductors as well as n-type and/or p-type semiconductors are used; for example, silicon, germanium, bismuth, antimony and tellurium are used in pure, p-doped or/and n-doped form or in combination. Likewise, it is possible to use semiconductor materials based on organic chemical compounds. The thermoelectric materials may be chosen from the group consisting of metals, metal alloys, semiconductors, electrically conductive polymers and electrically conductive inorganic materials. In addition, the thermoelectric materials may be chosen from the group consisting of chromium, iron, copper, silver, gold, nickel, platinum, rhodium, titanium, alloys of the aforesaid metals, electrically conductive polymers, p-type semiconductors, n-type semiconductors, especially doped silicon, doped germanium or bismuth antimony telluride, carbon, as well as any mixtures, alloys and compounds of two or more of the aforesaid substances.

It is particularly preferable to use TE materials of the following classes:

$Bi_xTe_yX_z$ (bismuth tellurides), where X=Sb, Sn and/or Se and x, y and z are, independent of one another, rational numbers greater than zero up to 10.

PbTe (lead tellurides).

$Si_{1-x}Ge_x$ (silicon germanides), where x represents a rational number greater than zero up to smaller than 1.

$Co_xSb_yX_z$ (cobalt antimonides), where X=Fe and/or Ce and x, y and z are, independent of one another, rational numbers greater than zero up to 15.

$Zn_xSb_y$ (zinc antimonides), where x and y are, independent of one another, rational numbers greater than zero up to 10.

$Fe_xSi_y$ (iron silicides), where x and y are, independent of one another, rational numbers greater than zero up to 10.

Organic semiconductors such as e.g. tetramethyltriphenyl-diamine doped polycarbonate (TMTPD), pentacene, tris-(8-hydroxyquinoline)aluminum or $TEA(TCNQ)_2$.

In this case it is not relevant whether the materials were produced by traditional semiconductor-manufacturing methods or by other methods, such as e.g. "thin-film superlattice", "quantum-well structured", "quantum-dot structured" or "non-quantum-confined" methods.

Hereinafter the inventive manufacture of a TE element will be described in more detail on the basis of an example.

For an operational TE layer, a well defined arrangement of legs of a first and a second thermoelectric material, typically p-doped and n-doped TE semiconductor legs, must be created in the flat carrier. The legs must be continuous from one side of the flat carrier to the other, but must be electrically insulated from one another within the flat carrier.

In order to produce such TE legs, either suitable TE materials must be introduced into the flat carrier in a well defined manner, or else suitable precursors of the TE materials must be introduced into the flat carriers and transformed to the respective TE-active forms by a subsequent transformation process.

Different methods of introducing TE materials or their precursors are available to the person skilled in the art. They can be divided into:

"Positive methods", in which the TE material or its precursor is applied selectively at the desired locations, e.g. by screen printing, ink-jet printing, spotwise melt infiltration or electrochemical deposition with positive resist on the back side.

"Negative methods", in which all regions in the carrier where no material is to be applied are closed/blocked by means of an auxiliary material, after which the still accessible regions are filled with TE material or its precursor by means of locally nonselective methods, e.g. by slurrying, immersion, electrochemical deposition, gas-phase deposition or melt infiltration, after which the auxiliary material is then removed as needed.

As already emphasized, the introduced materials can be either TE materials that are already active or precursors thereof, which are transformed to a TE-active form/modification only in further suitable process steps. Examples of such precursors can be TE materials in oxidic or otherwise chemically modified form, pure or mixed with further substances.

Mixtures of TE materials or their chemical modifications with solid, liquid or gaseous introduction enhancers.

TE materials or their chemical modifications in particle form, prepared in the form of powders or suspensions.

Mixtures of the aforesaid TE precursors with transformation enhancers, such as reducing and oxidizing agents.

The transformation of precursors introduced in this way into TE-active legs can be achieved e.g. by the following methods or combinations thereof:

Calcining (by the action of heat or radiation)

Sintering (by the action of heat or radiation)

Reduction (by chemical reducing agents or electrochemically)

Oxidation (by chemical oxidizing agents or electrochemically)

Precipitation

Crystallization

The flat carrier is unwound from a feed roll and infiltrated alternately with n-doped and p-doped TE precursor material at well defined locations in a printing process. These precursor materials are transformed to their respective TE-active form by a pass through a furnace. Finally, spotwise sputtering with nickel or another contact metal ensures good electrical contactability of the obtained TE legs.

The manufacture of interconnecting layers in porous substrates can take place by analogy with the manufacture of TE layers as described hereinabove. Suitable contact materials or precursors thereof must be introduced into the pore structure of the selected carrier in well defined manner according to the foregoing method. As contact materials there can be used:

Metals with good electrical conductivity, such as Cu, Al, Ag or Au.

Precursors of such metals, such as their oxides, chlorides or other chemical compounds.

Mixtures of metals or precursors with introduction enhancers.

Mixtures of the foregoing metals, precursors or mixtures thereof with transformation enhancers, such as reducing or oxidizing agents.

These materials can be introduced into the porous substrate in the form of solutions, suspensions, dispersions, powders or melts.

In contrast to the structures in porous media as described in the foregoing, interconnecting layers can also be built up on dense substrates. For this purpose, selectively determined regions of the substrate must be provided with suitable electrically conductive materials or suitable precursors that can be transformed thereto.

For this purpose it is possible to use the following manufacturing methods, for example:

Printing methods, such as screen printing or ink-jet methods.

Sputtering.

Etching methods (analogous to traditional manufacture of conductor paths).

Other material-removing methods, such as milling, polishing, planing or laser ablation.

Suitable conductive materials and precursors, and if necessary transformation thereof into the needed active form, are identical to those for formation in porous carriers.

In order to obtain an operational TE element, one or more successive TE layer(s) and interconnecting layers on both sides must be combined with one another to form a sandwich structure, or a suitable interconnection structure must be applied on both sides of the free outer faces of the TE layer(s).

Depending on the chosen material combinations, TE materials on the one hand and conductive materials in the interconnecting layers on the other hand, it may be necessary to introduce one or more contact enhancers between the two, in order to ensure a more durable connection and a charge-carrier and heat transport between TE layers and interconnecting layers with minimum losses. Under certain circumstances, when a plurality of TE layers is disposed on top of each other, it may even be necessary to insert suitable contact enhancers between them also for optimum electrical contacting of the TE legs in heat-flow direction.

Such contact enhancers are sufficiently known from traditional TE devices. They also support e.g. the injection or drain of charge carriers (electrons or holes) at the interfaces of the TE materials, facilitate the soldering, sintering or welding of the TE materials to the electrical conductive materials or in between the TE materials, and form an elastic joint between the functional layers, thus compensating e.g. for different thermal expansion coefficients.

Typical examples of contact enhancers are:

$Si_xGe_yX_z$ (X=further optional element for n-doping or p-doping)

tungsten
nickel
silver
gold

Combination of the various functional layers to usable sandwich structures can be achieved by analogy with established roll-to-roll methods, as are customary e.g. in the paper, packaging and laminate-floor industry. The functional layers manufactured by the foregoing methods are stacked one above the other in well defined manner and are durably joined mechanically and electrically by suitable methods.

Such methods are adequately known to the person skilled in the art. A non-exhaustive list of examples thereof includes:

calandering
hot pressing
furnace joining
laser joining

One possible embodiment of the inventive method is illustrated in FIG. 1.

FIG. 1 shows supply rolls (600), on which there are wound flat carrier or porous substrate (601, 611). Flat carrier (601) is unwound from supply roll (600), infiltrated with n-type semiconductor or a precursor thereof (603*a*) and with p-type semiconductor or a precursor thereof (603*b*), which are applied by infiltration devices (602*a*, 602*b*), and transported through a heating zone (604), in which calcining, oxidation or reduction as well as sintering take place or the precursors are transformed into TE materials, so that the TE material is present in n-doped (605*a*) and p-doped (605*b*) active form. Thereafter a contact enhancer (607) is applied on the flat carrier by application device (606), for example by a sputtering device that applies nickel.

To manufacture the interconnecting layers, the flat carrier (611) is unwound from supply roll (600), infiltrated with an electrical conductor such as copper or a precursor thereof (613), which is applied by infiltration device (612), and transported through a heating zone (614), in which calcining, oxidation or reduction as well as sintering take place or the precursors are transformed into electrical conductors (615). The interconnecting layer manufactured in this way is passed over deflecting rolls (616) onto a surface of the flat carrier (601) provided with TE material, and a further interconnecting layer is passed onto the other surface of the flat carrier provided with TE material.

The three-layer composite is permanently joined in a calandering machine (608), and the finished composite (609) is wound onto an intermediate-storage roll (610), so that if necessary it can be subsequently subjected to further assembly.

In contrast to the manufacture of separate interconnecting layers as described in the foregoing, it is also possible to produce, directly on both sides or on one side of the TE layer, the structures necessary for interconnection of the TE layer and for contacting it in a manner that permits efficient heat transfer. Coating techniques known in themselves to the person skilled in the art can be used for this purpose.

A non-exhaustive list of examples thereof includes sputtering, soldering methods, foil coating, printing processes and ink-jet processes.

Using these methods, the electrically conductive materials or suitable precursors thereof can be applied in a well defined arrangement on the TE layer.

If necessary, further downstream transformation processes must be applied to transform precursors into the needed final material forms, such as e.g. sintering, calcining, reduction (by chemical reducing agents or by electrochemical processes), oxidation (by chemical oxidizing agents or by electrochemical processes) or reprecipitation.

For very large usable temperature differences in the planned use of a TEG or for large desired temperature differences to be established in a Peltier element, the efficiency can be further increased by selecting a structure comprising a plurality of TE layers that may even contain different TE materials (for functional grading) instead of only one TE layer. In this way, it can be ensured that each of the different TE materials operates in its optimum temperature range along the temperature profile being formed in the TE device. Depending on the TE materials, the combination of a plurality of TE layers may necessitate the use of a suitable contact enhancer, as already described.

The outermost layer of a TE element forms the electrical insulating layer. It is needed in most, if not all applications. It can be manufactured either as a separate layer by analogy with the other functional layers and then combined with the TE element, or it can be applied on the finished TE element in the form of a coating.

Separately prepared layers can be manufactured by methods similar to those for the other functional layers, for example by complete filling of the pore volume of a porous substrate with a suitable filler material.

Separately manufactured insulating layers can be combined with the TE device by analogy with the internal functional layers. A non-exhaustive list of examples of methods for this purpose includes calandering, (hot) pressing, gluing, shrink-fitting (e.g. a shrink tube around the entire module).

Depending on the application situation, even a loose arrangement without mechanical connection between insulating layer and TE element is conceivable, although good heat transfer between insulating layer and TE element must be ensured (e.g. by suitable clamping/squeezing pressure and/or suitable geometry of the surfaces in contact with one another).

Alternatively, an insulating layer can be applied in the form of a coating. A non-exhaustive list of examples of this includes immersion, lacquering (e.g. with solvent, emulsion or powder lacquer), washcoating (e.g. with ceramic slips), vapor deposition methods (e.g. PVD or CVD), sputtering, shrink-in-place methods or potting.

Finally, the large-area TE elements manufactured according to the inventive method can be, adapted to the application situation, subdivided to size in the needed geometries by cutting, sawing, punching or any other desired methods, and assembled. Leads, soldering lugs or contact pins can be attached as needed by soldering, stamping, imprinting, gluing or other methods.

For certain applications, it may be necessary to provide a further coating or housing as protection against certain environmental influences. Coating/sealing can be accomplished by methods known in themselves. A non-exhaustive list of coating methods includes immersion, lacquering (e.g. with solvent, emulsion or powder lacquer), vapor deposition methods (e.g. PVD or CVD) and sputtering.

Housings can have the form of rigid or flexible envelopes of suitable geometry, in which the TE elements are mounted. Other options are shrink-in-place processes or potting.

The invention also relates to the use of the thermoelectric element for generation of electrical energy, for generation or dissipation of thermal energy, and for temperature measurement.

In a preferred embodiment, there are used as heat sources exhaust gases, wastewaters, surfaces heated by the sun or other sources, floors and mats insulating a cooler substructure, or temperature differences in process technology.

This applies in particular to exhaust gases of heating systems, power plants, motor vehicles, ships or aircraft.

A further preferred heat source for operation of the inventive thermoelectric elements is body heat.

Figure 2:
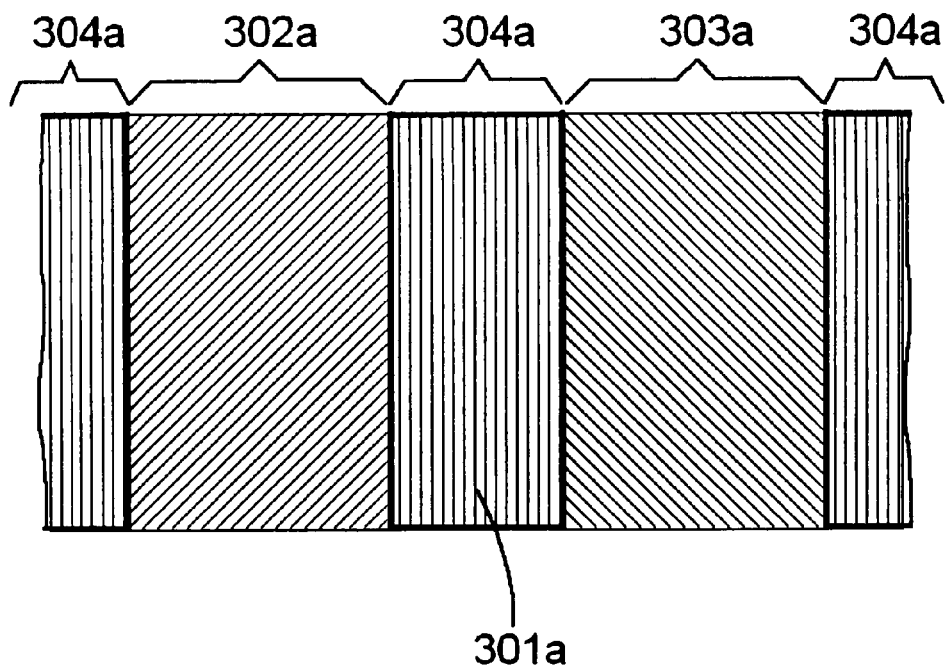
FIG. 2 is a schematic side view (section) of an exemplary TE layer or filled interconnecting layer.

The invention will be explained in more detail in FIGS. 2 to 12, but is not to be construed as limited to those embodiments. There is shown in:

FIG. 2: A schematic side view (section) of an inventive TE layer or filled interconnecting layer.

There is illustrated an electrically insulating carrier material or substrate (301a). This has regions or pores (302a) filled with n-doped thermoelectrically active semiconductor material and regions or pores (303a) filled with p-doped thermoelectrically active semiconductor material.

This structure can also be used as an interconnecting layer. In this case an electrically insulating carrier material or substrate is present in the form of an unfilled region or massive substrate material (304a), combined with electrically conductive material in filled regions or pores (302a, 303a).

Figure 3:
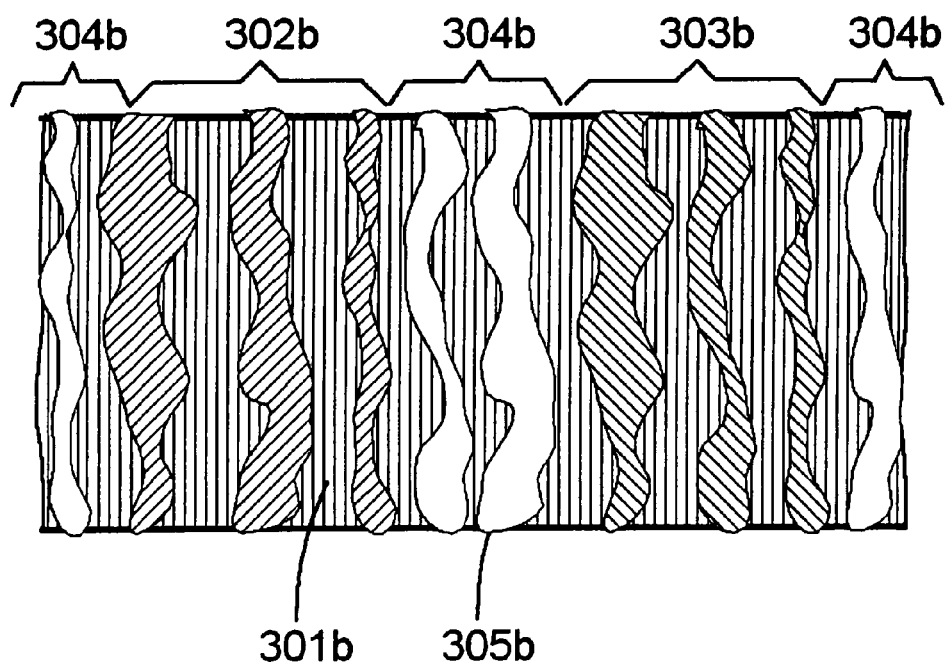
FIG. 3 is a schematic side view (section) of an exemplary TE layer filled interconnecting layer in an example of a carrier/substrate with continuous pores.

FIG. 3: A schematic side view (section) of an inventive TE layer or filled interconnecting layer in the example of a carrier/substrate with continuous pores.

There is illustrated an electrically insulating carrier material or substrate (301b). This has regions with pores (302b) filled with n-doped thermoelectrically active semiconductor material and regions with pores (303b) filled with p-doped thermoelectrically active semiconductor material.

This structure can also be used as an interconnecting layer. In this case an electrically insulating carrier material or substrate is present in the form of an unfilled region with free pore volume (304b), combined with regions containing pores (302b, 303b) filled with electrically conductive material. The figure also shows an unfilled continuous pore (305b).

Figure 4:
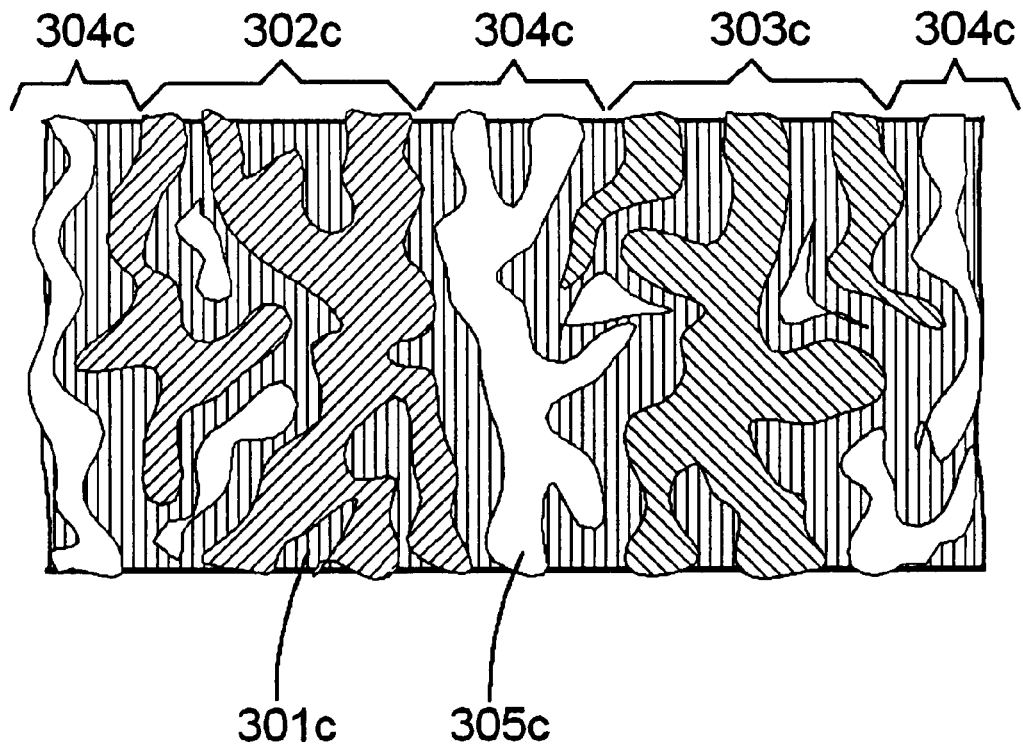
FIG. 4 is a schematic side view (section) of an exemplary TE layer or filled interconnecting layer in an example of a carrier/substrate with continuous and non-continuous pores.

FIG. 4: A schematic side view (section) of an inventive TE layer or filled interconnecting layer in the example of a carrier/substrate with continuous and non-continuous pores.

There is illustrated an electrically insulating carrier material or substrate (301c). This has regions with pores (302c) filled with n-doped thermoelectrically active semiconductor material and regions with pores (303c) filled with p-doped thermoelectrically active semiconductor material. The carrier material contains continuous and non-continuous pores, some of which are highly branched or tortuous.

This structure can also be used as an interconnecting layer. In this case an electrically insulating carrier material or substrate is present in the form of an unfilled region with free pore volume (304c) combined with regions containing pores (302c, 303c) filled with electrically conductive material. The figure also shows an unfilled continuous pore (305c).

Figure 5:
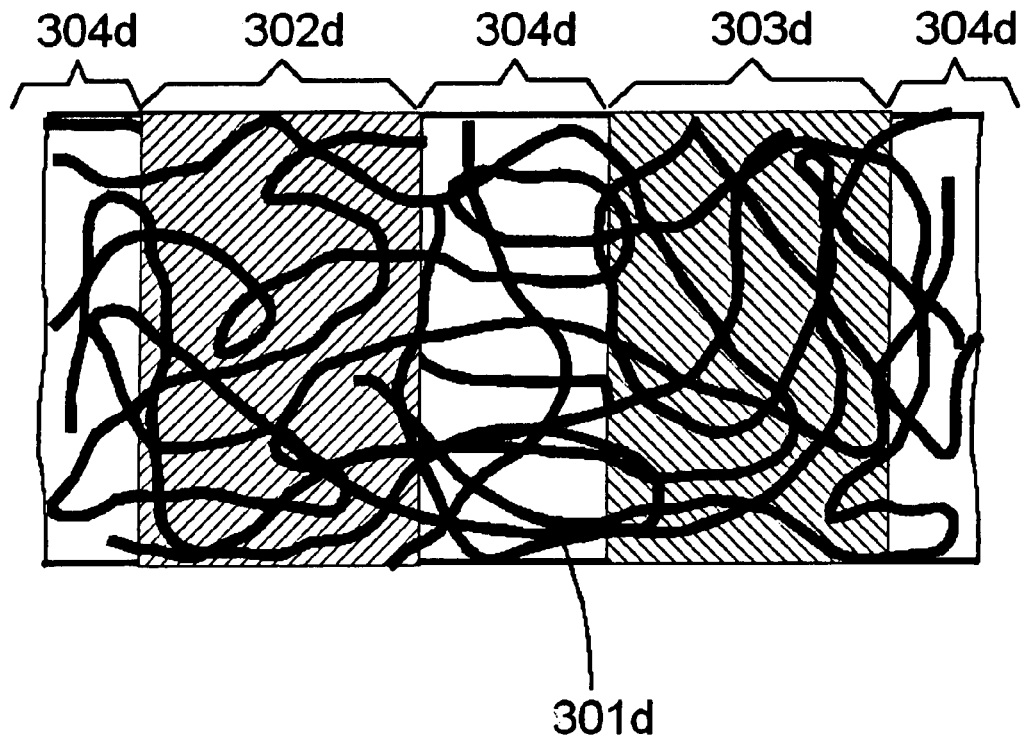
FIG. 5 is a schematic side view (section) of an exemplary TE layer or filled interconnecting layer in an example of a carrier/substrate formed from fibers (such as fleece, felt, wove cloth)

FIG. 5: A schematic side view (section) of an inventive TE layer or filled interconnecting layer in the example of a carrier/substrate formed from fibers (such as fleece, felt, woven cloth).

There is illustrated an electrically insulating carrier material or substrate (301d) of electrically insulating fibers. This has regions (302d) filled with n-doped thermoelectrically active semiconductor material and regions (303d) filled with p-doped thermoelectrically active semiconductor material.

This structure can also be used as an interconnecting layer. In this case an electrically insulating carrier material or substrate is present in the form of an unfilled region with free pore volume (304d), combined with regions containing electrically conductive material (302d, 303d).

Figure 6:
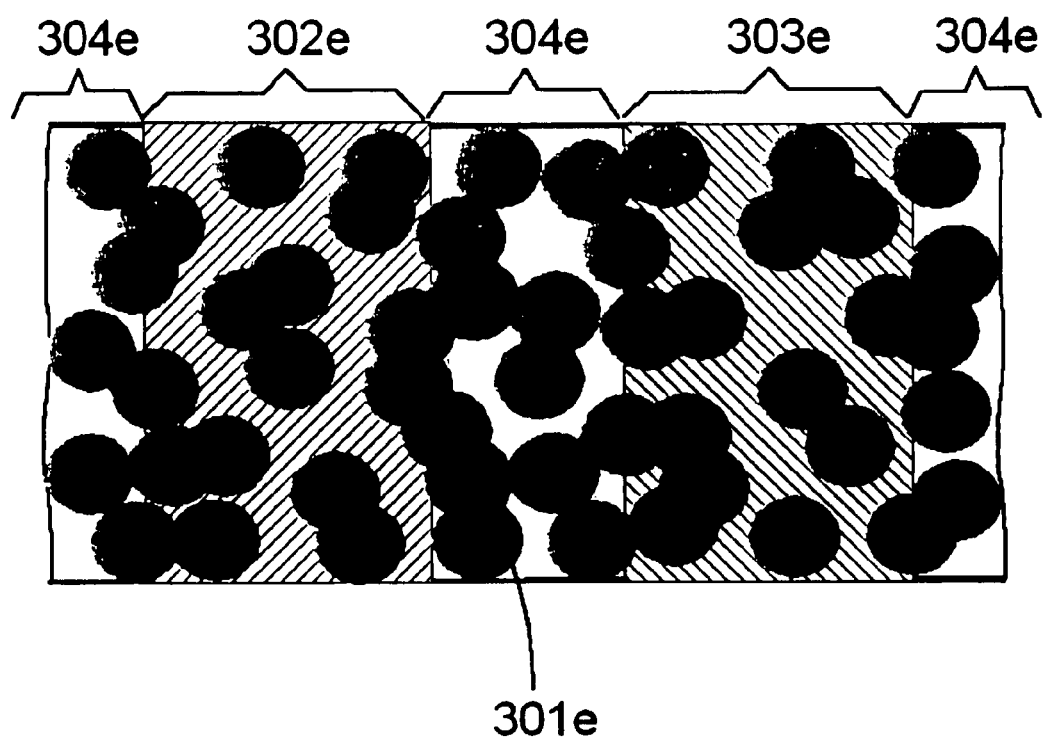
FIG. 6 is a schematic side view (section) of an exemplary TE layer or filled interconnecting layer in the example of a carrier/substrate formed from sintered or cemented particles.

FIG. 6: A schematic side view (section) of an inventive TE layer or filled interconnecting layer in the example of a carrier/substrate formed from sintered or cemented particles.

There is illustrated an electrically insulating carrier material or substrate (301e) of electrically insulating particles. This has regions (302e) filled with n-doped thermoelectrically active semiconductor material and regions (303e) filled with p-doped thermoelectrically active semiconductor material.

This structure can also be used as an interconnecting layer. In this case an electrically insulating carrier material or substrate is present in the form of an unfilled region with free pore volume (304e), combined with regions containing electrically conductive material (302e, 303e).

Figure 7:
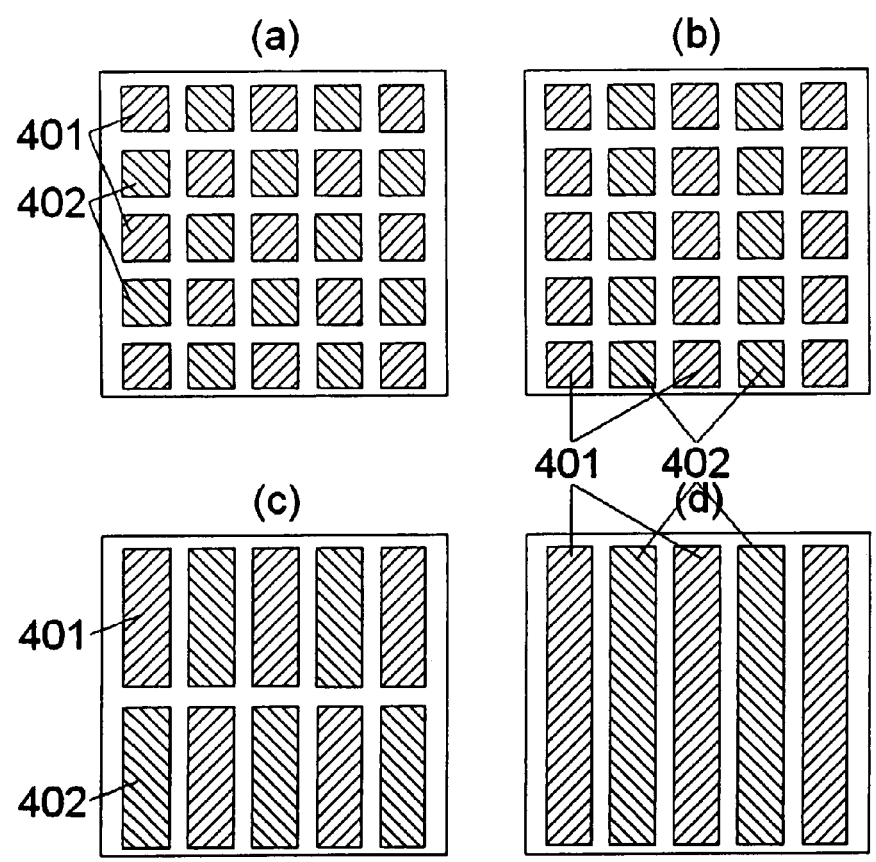
FIGS. 7A-7D is a schematic top view of the top side or bottom side of flat carriers/substrates with possible arrangements of n-doped and p-doped TE legs.

FIG. 7: A schematic top view of the top side or bottom side of flat carriers/substrates with possible arrangements of n-doped and p-doped TE legs.

There are illustrated different arrangements of n-doped TE legs (401) and p-doped TE legs (402).

FIG. 7a shows an alternating arrangement (resembling a checkerboard) of the TE legs, such as can be found in most thermoelectric devices that have been commercially available heretofore.

FIG. 7b shows TE legs arranged in alternating parallel rows.

FIG. 7c shows TE legs with rectangular horizontal projection.

FIG. 7d shows alternating TE legs in the form of long continuous rows.

Figure 8:
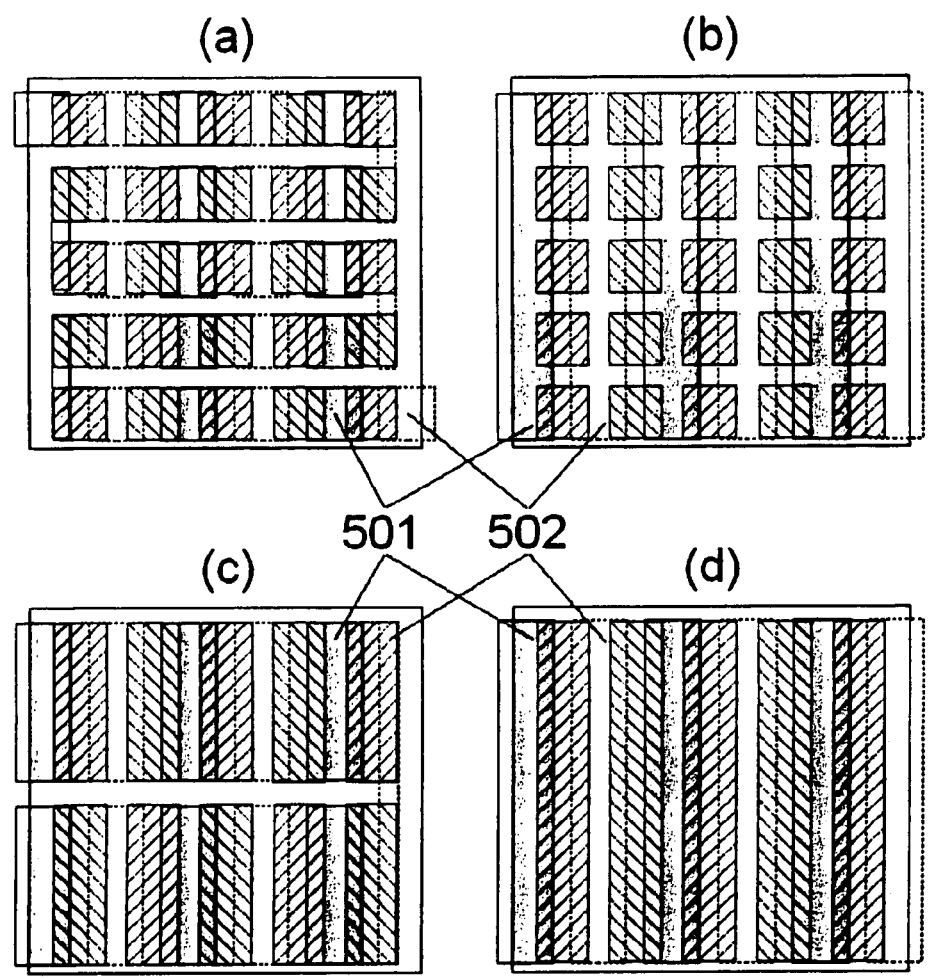
FIGS. 8A-8D is a schematic top view of the top side or bottom side of flat carriers/substrates with possible arrangements of n-doped and p-doped TE legs and electrical interconnecting structures applied on both surfaces.

FIG. 8: A schematic top view of the top side or bottom side of flat carriers/substrates with possible arrangements of n-doped and p-doped TE legs and electrical interconnecting structures applied on both surfaces.

There are illustrated interconnections of the arrangements of n-doped and p-doped TE legs shown in FIGS. 7a to 7d (corresponding to FIGS. 8a to 8d).

The interconnecting structures (501) applied on the top side are illustrated in dark gray, while the interconnecting structures (502) applied on the bottom side are illustrated as hatched regions.

Figure 9:
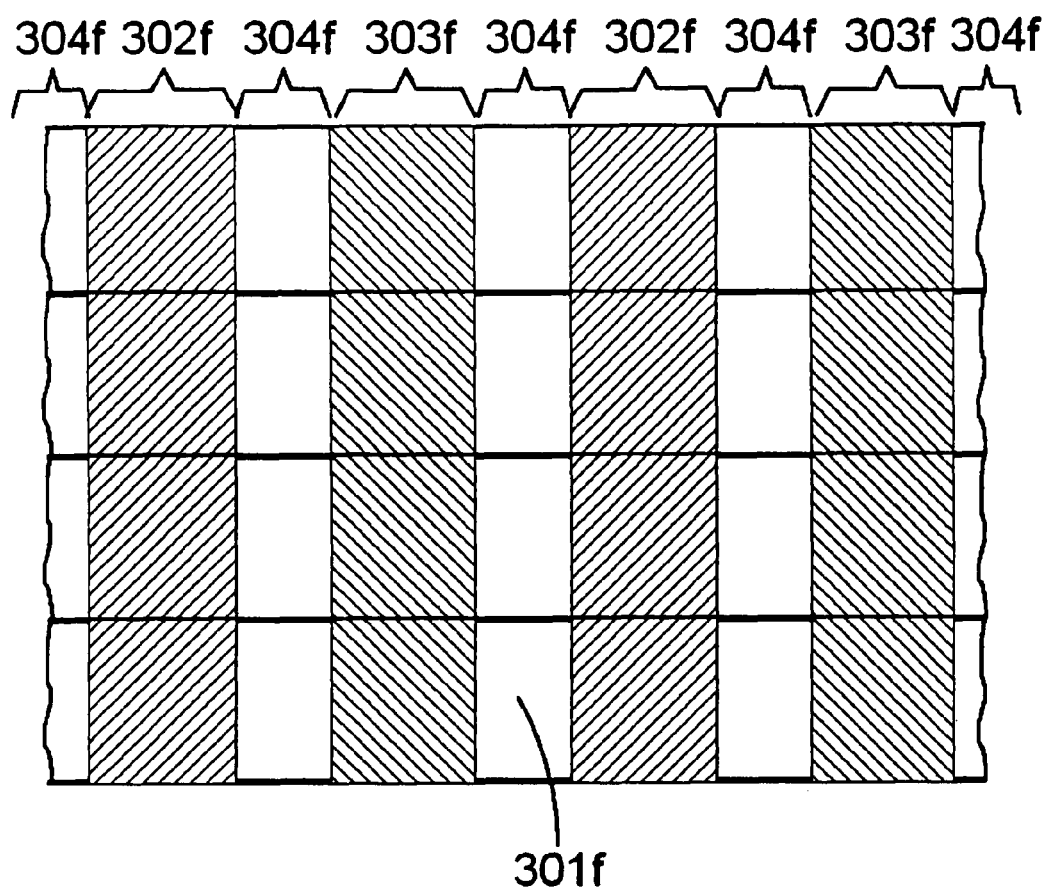
FIG. 9 is a schematic side view (section) of an exemplary multi-layer TE layer.

FIG. 9: A schematic side view (section) of an inventive multi-layer TE layer.

There is illustrated a plurality of layers of electrically insulating porous carrier material or substrate (301f). These have regions (302f) filled with n-doped thermoelectrically active semiconductor material and regions (303f) filled with p-doped thermoelectrically active semiconductor material. Unfilled electrically insulating regions (304f) are also shown.

Figure 10:
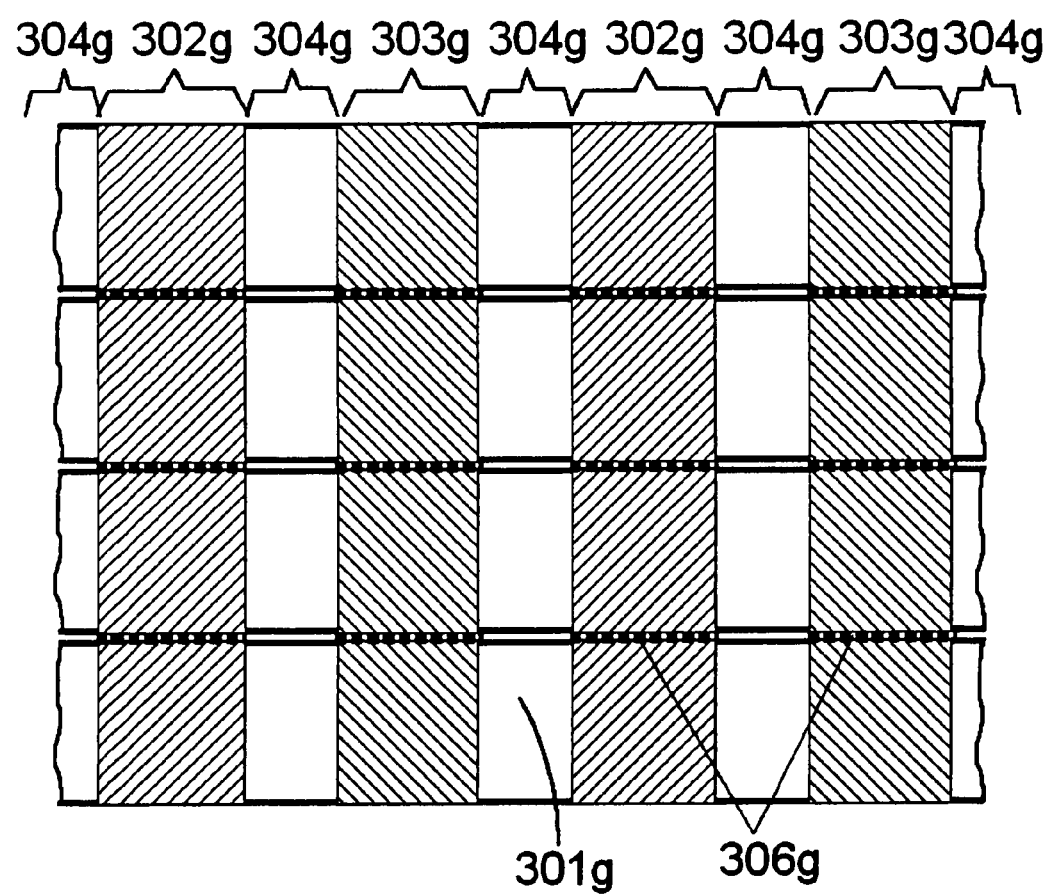
FIG. 10 is a schematic side view (section) of an exemplary multi-layer TE layer with contact enhancers located between the TE legs stacked on top of each other.

FIG. 10: A schematic side view (section) of an inventive multi-layer TE layer with contact enhancers located between the TE legs stacked on top of each other.

There is illustrated a plurality of layers of electrically insulating porous substrate material or carrier (301g). These have regions (302g) filled with n-doped thermoelectrically active semiconductor material and regions (303g) filled with p-doped thermoelectrically active semiconductor material. Unfilled electrically insulating regions (304g) are also shown. Between the individual layers of the substrate (301g) there are located regions (306g) containing contact enhancers, which connect the regions (302g, 303g) of the individual layers filled with active semiconductor material electrically with one another.

Figure 11:
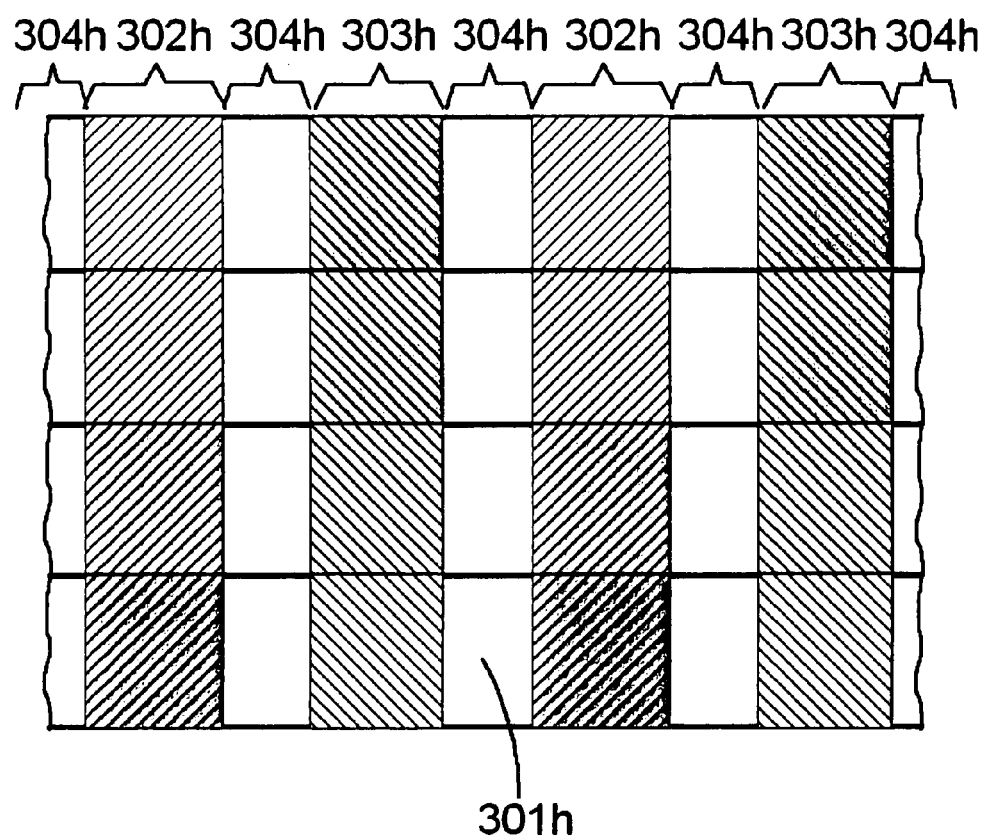
FIG. 11 is a schematic side view (section) of an exemplary multi-layer TE layer with functional grading.

FIG. 11: A schematic side view (section) of an inventive multi-layer TE layer with functional grading.

There is illustrated a plurality of layers of electrically insulating porous carrier material or substrate (301h). These have regions (302h) filled with n-doped thermoelectrically active semiconductor material and regions (303h) filled with p-doped thermoelectrically active semiconductor material. These regions differ in the individual layers of the substrate (301h). The different shades of gray symbolize different TE materials. Unfilled electrically insulating regions (304h) are also shown.

Figure 12:
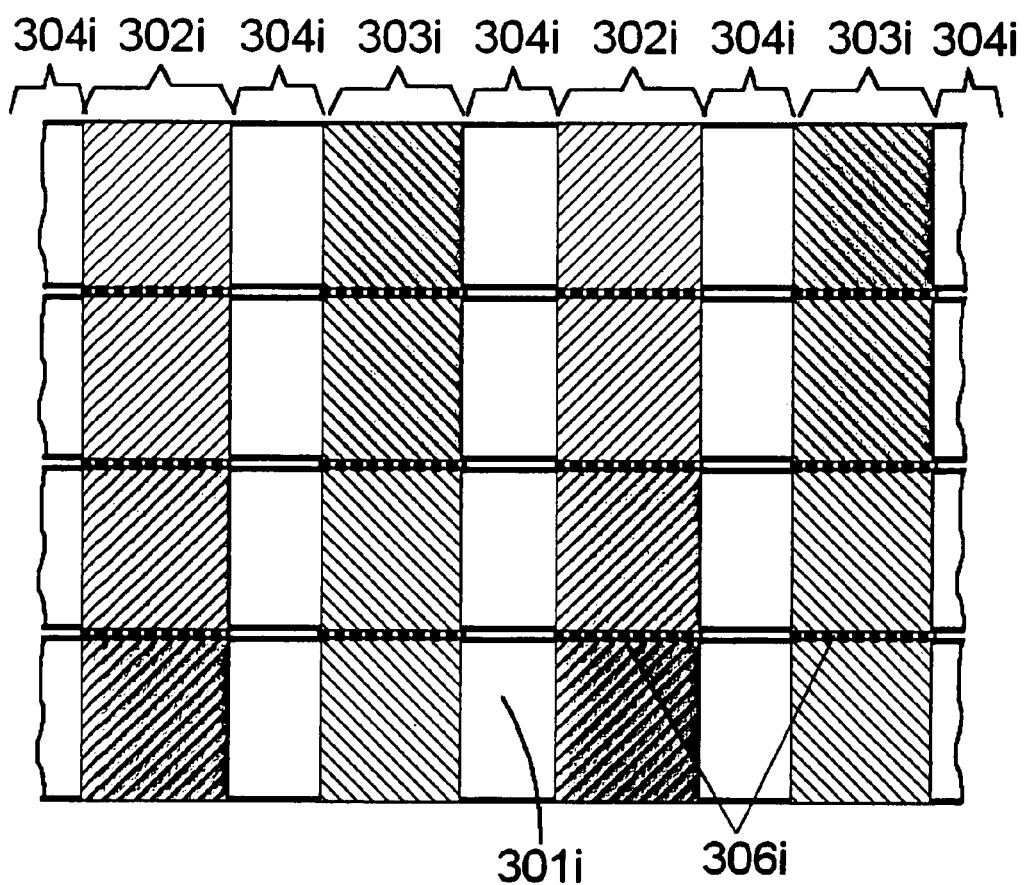
FIG. 12 is a schematic side of an exemplary multi-layer TE layer with functional grading an with contact enhancers located between the TE legs stacked on top of each other.

FIG. 12: A schematic side view (section) of an inventive multi-layer TE layer with functional grading and with contact enhancers located between the TE legs stacked on top of each other.

There is illustrated a plurality of layers of electrically insulating porous carrier material or substrate (301i). These have regions (302i) filled with n-doped thermoelectrically active semiconductor material and regions (303i) filled with p-doped thermoelectrically active semiconductor material. These regions differ in the individual layers of the substrate (301i). The different shades of gray symbolize different TE materials. Unfilled electrically insulating regions (304i) are also shown. Between the individual layers of the substrate (301i) there are disposed regions (306i) containing contact enhancers, which connect the regions (302i, 303i) of the individual layers filled with active semiconductor material electrically with one another.

Figure 13A:
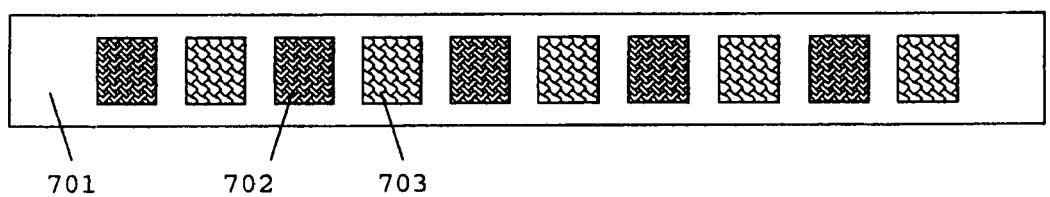
FIGS. 13A and 13B shows TE element of example 2.
Figure 13B:
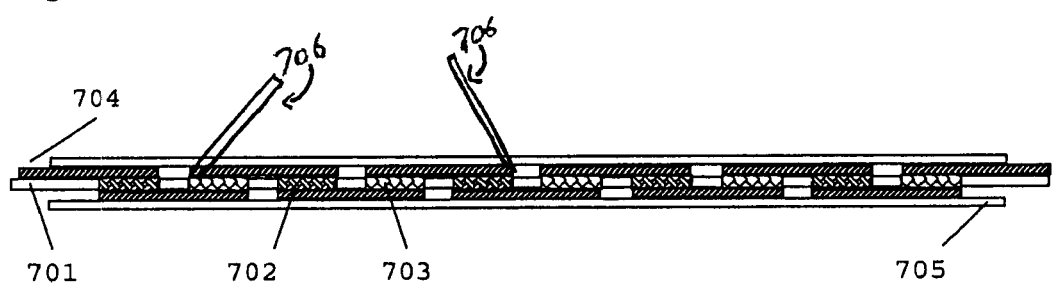

FIG. 13: TE element of example 2 in top view before electrical contacting (FIG. 13a) and in side view after electrical contacting and application of the electrical insulation layer (FIG. 13b).

In the substrate strip (701) are located alternately areas (702, 703) filled with n-doped and p-doped bismuth telluride, which are connected alternately on the top and bottom side of the substrate by copper foil (704) electrically conducting to form thermocouples in a series circuit and are covered on both sides by electrically isolating layers of an alumina membrane (705). A plurality of leads (706) feed or draw electrical energy and are electrically connected to the thermocouples.

The contacting in FIG. 13b corresponds to the contacting in FIG. 8d.

The examples hereinafter explain the invention without limiting it.

EXAMPLES

Examples 1a, 1b and 1c

Melt Infiltration

Different samples of porous flat materials coated with ceramic were infiltrated with molten bismuth telluride ($Bi_2Te_3$).

There were used flat carriers of glass-fiber woven cloth (Example 1a), polyethylene terephthalate fleece (PET fleece) (Example 1b) and stainless-steel woven cloth (Example 1c).

Each flat carrier was coated with fine-grained alumina ($Al_2O_3$) and was prepared by the process known from WO 03/072231.

These sample patches were placed on a suction filter in such a way that a negative pressure could be generated on the bottom side of the substrate. Thereafter a small quantity of molten bismuth telluride was applied on the top side of the substrate. In all cases, it was found that the melt penetrated to the bottom side of the substrate before solidification. In all cases, electrical conductivity from the top side to the bottom side of the substrate was detected. This indicates that continuous legs of bismuth telluride had been formed.

In the substrate of Example 1c, however, electrical conductivity was also found in the substrate face, leading to the conclusion that the ceramic coating of the woven cloth was not complete. In this form, therefore, this material is not suitable as a substrate for inventive TE elements.

In contrast, the substrate of Example 1b exhibited breaks and fissures at the periphery of the infiltrated region.

The infiltrated region was easily broken out. This is understandable, since the temperature of the bismuth telluride melt, at over 600° C., is well above the melting and decomposition temperature of the PET.

The substrate of Example 1a did not exhibit any mechanical weaknesses whatsoever that suggested a negative effect of the infiltration process.

The measured electrical conductivities of the produced TE legs were on the order of magnitude of those of massive bismuth telluride, and so a separate time-consuming determination of the Seebeck coefficient was not performed. It can be safely assumed that the obtained legs have thermoelectric activity.

Example 2

Dispersion Infiltration

Powders of n-doped bismuth telluride (n-$Bi_2Te_3$) and p-doped bismuth telluride (p-$Bi_2Te_3$) with particle sizes smaller than 5 μm were prepared by grinding and sieving.

Both powders were dispersed to viscous pastes, each with the same volume of a dispersion enhancer. A bis-trimethylsilyl-polyethylenglycol with an average molecular mass of 400 to 500 g/mol was used as the dispersion enhancer.

Dispersed n-$Bi_2Te_3$ and p-$Bi_2Te_3$ were applied alternately as square legs of 1 cm side length onto a strip of hollow-glass-fiber woven cloth type 216g supplied by R&G Faserverbundwerkstoffs GmbH, Waldenbuch. In the process, the pastes were pressed through the woven cloth voids such that they discharged at the bottom side of the carrier substrate and the woven cloth was completely soaked in the region of the leg area. A distance of at least 5 mm, which was not soaked, was kept between the leg areas. A total of 10 legs (5 p-legs and 5 n-legs) were primed.

The primed substrate strip was then heated in an oven at 250° C. for 30 min to calcine the dispersion enhancer. Subsequently the TE legs were connected electrically alternately on the top and bottom side of the strip by spreading them with a silver conducting laquer and connecting them alternately with copper foils in an electrical series circuit. Thin strips of an alumina membrane (ccflex) were placed as an electrically insulating layer on each the top side and bottom side of the primed and contacted substrate strip.

The thermoelement strip prepare this way was placed between to metal profiles so that in each case the complete area of the alumina membrane was in contact with the metal profiles. One of the metal profiles was kept at a temperature of 0±10° C., the other metal profile at 100±30° C. The total open-circuit voltage (without current) resulting from the thermoelectric effect was measured between the ends of the series circuit. Open-circuit voltages of 50 mV to 160 mV were measured depending on the temperature difference.

The invention claimed is:
1. A thermoelectric element comprising:
   a continuous flat carrier of porous electrically and thermally insulating material, which has a first surface and a second surface, wherein the continuous flat carrier has a disordered geometry of pores, some of the pores being continuous with respect to the first and second surfaces of the continuous flat carrier and others being non-continuous with respect to the first and second surfaces of the continuous flat carrier;

a first thermocouple, formed by at least one first electrical conductor, running through the pores of the continuous flat carrier from the first to the second surface and including a first thermoelectric material, and at least one second electrical conductor, running through the pores of the continuous flat carrier from the first to the second surface and including a second thermoelectric material, wherein the at least one first and second electrical conductors including the first and second thermoelectric materials run through the continuous flat carrier in a manner electrically insulated from one another and are connected to one another in an electrically conductive manner on the first surface or the second surface of the continuous flat carrier;

a second thermocouple, formed by at least one third electrical conductor, running through the pores of the continuous flat carrier from the first to the second surface and including a third thermoelectric material, and at least one fourth electrical conductor, running through the pores of the continuous flat carrier from the first to the second surface and including a fourth thermoelectric material, wherein the at least one third and fourth electrical conductors including the third and fourth thermoelectric materials run through the continuous flat carrier in a manner electrically insulated from one another, and are connected to one another in an electrically conductive manner on a surface of the continuous flat carrier on which the first and second thermoelectric materials forming the first thermocouple are connected to one another in electrically conductive manner, wherein the first thermocouple and the second thermocouple are formed by identical or different electrical conductors, and the first, second, third, and fourth thermoelectric materials include p-type and n-type semiconductor materials;

an electrically conductive connection of ends of the first and second thermocouples are in a parallel or series circuit; and a plurality of leads that feed or draw electrical energy, said plurality of leads being electrically connected to the first and second thermocouples.

2. The thermoelectric element of claim 1, wherein the continuous flat carrier is an electrically and thermally insulating textile fabric, an open-pore foam material, a sponge or a sintered article, which are composed of organic or inorganic polymers, glass, ceramic materials, carbides, nitrides, borides or mixtures thereof.

3. The thermoelectric element of claim 2, wherein the continuous flat carrier is a woven cloth, warp knit, gauze, weft knit, felt or fleece.

4. The thermoelectric element of claim 1, further comprising at least a third thermocouple.

5. The thermoelectric element according to claim 1, wherein the electrically conductive connection of the ends of the first and second thermocouples occurs on both the first and second surfaces of the continuous flat carrier.

6. The thermoelectric element according to claim 4, wherein all thermocouples are interconnected by electrical series or parallel circuits in such a way that voltage or current values of all the thermocouples add together.

7. The thermoelectric element according to claim 1, wherein the electrically conductive connection is an electrically conductive foil, which is applied on predetermined regions of at least one of the first and second surfaces of the continuous flat carrier.

8. The thermoelectric element according to claim 1, wherein the first, second, third, and fourth thermoelectric materials are selected from a group consisting of metals, metal alloys, semiconductors, electrically conductive polymers and electrically conductive inorganic materials.

9. The thermoelectric element according to claim 1, wherein the first, second, third, and fourth thermoelectric materials are selected from a group consisting of chromium, iron, copper, silver, gold, nickel, platinum, rhodium, titanium, alloys of the aforesaid metals, electrically conductive polymers, p-type semiconductors and n-type semiconductors; wherein the semiconductors include one or more of doped silicon, doped germanium or bismuth, antimony telluride, or carbon, as well as any mixtures, alloys and compounds of two or more of the aforesaid substances.

* * * * *